(12) United States Patent
Roesner et al.

(10) Patent No.: US 9,606,313 B2
(45) Date of Patent: Mar. 28, 2017

(54) SYSTEM INCLUDING A MODULE

(71) Applicant: HEWLETT-PACKARD DEVELOPMENT COMPANY, L.P., Houston, TX (US)

(72) Inventors: Arlen L. Roesner, Ft. Collins, CO (US); Paul Kessler Rosenberg, Sunnyvale, CA (US); Michael Renne Ty Tan, Menlo Park, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/822,281

(22) Filed: Aug. 10, 2015

(65) Prior Publication Data

US 2015/0346444 A1 Dec. 3, 2015

Related U.S. Application Data (63) Continuation of application No. 13/810,665, filed as application No. PCT/US2010/043233 on Jul. 26, 2010, now Pat. No. 9,107,294.

(51) Int. Cl.

| G02B 6/36 | (2006.01) |
|---|---|
| G02B 6/43 | (2006.01) |
| G02B 6/44 | (2006.01) |
| H05K 5/00 | (2006.01) |
| H05K 7/02 | (2006.01) |

(Continued)

(52) U.S. Cl.
CPC ............... *G02B 6/43* (2013.01); *G02B 6/428* (2013.01); *G02B 6/4292* (2013.01); *G02B 6/4453* (2013.01); *H05K 5/00* (2013.01); *H05K 7/02* (2013.01); *G02B 6/389* (2013.01); *G02B 6/3897* (2013.01); *G02B 6/42* (2013.01)

(58) Field of Classification Search
CPC ........ G02B 6/43; G02B 6/428; G02B 6/4453; G02B 6/4292; G02B 6/389; G02B 6/3897; G02B 6/42; H05K 5/00; H05K 7/02
USPC .................. 385/14–15, 53, 88–89
See application file for complete search history.

(56) References Cited

U.S. PATENT DOCUMENTS 3,007,131 A * 10/1961 Dahlgren ............... H01R 12/59
439/492
4,579,406 A 4/1986 Laursen et al.
(Continued)

FOREIGN PATENT DOCUMENTS

| CN | 1292182 | 4/2001 |
|---|---|---|
| CN | 1629668 | 6/2005 |

(Continued)

OTHER PUBLICATIONS

International Searching Authority, International Search Report and Written Opinion, Appln No. PCT/US2010/043233, date of mailing Apr. 29, 2011, 9 p.

*Primary Examiner* — Ryan Lepisto
*Assistant Examiner* — Guy Anderson
(74) *Attorney, Agent, or Firm* — Hewlett Packard Enterprise Patent Department (57) ABSTRACT

A system includes a chassis and a slot in the chassis. The slot has a depth dimension along which a removable module may be moved to insert the module in the slot and remove the module from the slot. The system includes waveguides, which have couplers that are arranged at different depths of the slot to couple the waveguides to the module in response to the module being inserted into the slot.

13 Claims, 6 Drawing Sheets

(51) Int. Cl.
*G02B 6/38* (2006.01)
*G02B 6/42* (2006.01)

(56) References Cited

U.S. PATENT DOCUMENTS

| | | | | |
|---|---|---|---|---|
| 4,870,637 A * | 9/1989 | Follett | ............ | H04Q 1/155 |
| | | | | 398/164 |
| 5,026,292 A | 6/1991 | Pickles et al. | | |
| 5,373,109 A | 12/1994 | Argyrakis et al. | | |
| 5,488,682 A | 1/1996 | Sauter | | |
| 5,530,287 A | 6/1996 | Currie et al. | | |
| 5,673,346 A * | 9/1997 | Iwano | ............ | G02B 6/3817 |
| | | | | 385/60 |
| 5,793,919 A * | 8/1998 | Payne | ............ | G02B 6/2804 |
| | | | | 385/134 |
| 5,835,646 A | 11/1998 | Yoshimura | | |
| 5,893,761 A | 4/1999 | Longueville | | |
| 5,963,681 A | 10/1999 | Clements | | |
| 5,987,198 A | 11/1999 | Hirota et al. | | |
| 6,335,869 B1 | 1/2002 | Branch et al. | | |
| 6,440,770 B1 | 8/2002 | Banerjee et al. | | |
| 6,473,300 B1 * | 10/2002 | Youngquist | ............ | G11B 33/125 |
| | | | | 359/350 |
| 6,621,950 B2 * | 9/2003 | Kato | ............ | G02B 6/43 |
| | | | | 385/130 |
| 6,654,515 B2 * | 11/2003 | Kato | ............ | G02B 6/43 |
| | | | | 385/129 |
| 6,952,744 B2 * | 10/2005 | Farnworth | ............ | G06F 1/184 |
| | | | | 710/105 |
| 7,094,095 B1 | 8/2006 | Caveney | | |
| 7,142,748 B1 | 11/2006 | Yang | | |
| 7,209,621 B2 * | 4/2007 | Glebov | ............ | G02B 6/43 |
| | | | | 385/129 |
| 7,220,130 B2 | 5/2007 | Spitler et al. | | |
| 7,245,498 B2 * | 7/2007 | Togami | ............ | G02B 6/4246 |
| | | | | 174/350 |
| 7,278,855 B2 | 10/2007 | Yasumura et al. | | |
| 7,362,934 B2 | 4/2008 | Hamano | | |
| 8,570,762 B2 * | 10/2013 | Rosenberg | ............ | G02B 6/43 |
| | | | | 361/752 |
| 2002/0021855 A1 * | 2/2002 | Kim | ............ | G02B 6/43 |
| | | | | 385/15 |
| 2002/0065971 A1 | 5/2002 | Farnworth et al. | | |
| 2004/0166905 A1 | 8/2004 | Cherniski | | |
| 2005/0047795 A1 * | 3/2005 | Windover | ............ | H04B 10/801 |
| | | | | 398/164 |
| 2005/0196106 A1 | 9/2005 | Taira | | |
| 2006/0045417 A1 * | 3/2006 | Morita | ............ | H04B 10/801 |
| | | | | 385/31 |
| 2007/0092185 A1 * | 4/2007 | Sasaki | ............ | G02B 6/3885 |
| | | | | 385/89 |
| 2008/0002988 A1 | 1/2008 | Cheng | | |
| 2008/0095503 A1 | 4/2008 | Hasegawa et al. | | |
| 2008/0166090 A1 | 7/2008 | Kiani et al. | | |
| 2008/0186667 A1 | 8/2008 | Verdiell | | |
| 2008/0222351 A1 | 9/2008 | Verdiell et al. | | |
| 2009/0097803 A1 * | 4/2009 | Yeo | ............ | H04B 10/801 |
| | | | | 385/89 |
| 2009/0163043 A1 | 6/2009 | Demers | | |
| 2011/0280513 A1 * | 11/2011 | Morris | ............ | G02B 6/43 |
| | | | | 385/14 |
| 2011/0286691 A1 | 11/2011 | Hopkins | | |
| 2011/0293225 A1 * | 12/2011 | Daikuhara | ............ | G02B 6/4284 |
| | | | | 385/89 |
| 2012/0027354 A1 * | 2/2012 | Katayama | ............ | H04B 10/801 |
| | | | | 385/54 |
| 2012/0039562 A1 * | 2/2012 | Tan | ............ | G02B 6/325 |
| | | | | 385/14 |
| 2012/0051688 A1 | 3/2012 | Pitwon | | |
| 2012/0063725 A1 | 3/2012 | Meadowcroft | | |
| 2012/0195548 A1 * | 8/2012 | Brunner | ............ | H04B 10/803 |
| | | | | 385/18 |

FOREIGN PATENT DOCUMENTS

| | | |
|---|---|---|
| CN | 1886688 | 12/2006 |
| KR | 20060067946 | 12/2006 |

\* cited by examiner

SYSTEM INCLUDING A MODULE

CROSS-REFERENCE TO RELATED APPLICATIONS

This application is a continuation of U.S. patent application Ser. No. 13/810,665, which was filed on Jan. 16, 2013, and was a national stage application under 35 U.S.C. §371 of PCT/US1043233, which was filed on Jul. 26, 2010. Each of these applications is hereby incorporated by reference in its entirety.

BACKGROUND

A computing system may be a modular system. The system may include a processing module and a storage module for example. The modules can be installed in a chassis that provides communication channels and power to the modules. The chassis provides a communications channel between the modules and can also provide the modules with power. The channel between the modules may cause a module to wait before it can send data to another module.

BRIEF DESCRIPTION OF THE DRAWINGS

Some embodiments of the invention are described with respect to the following figures.

DETAILED DESCRIPTION

A computing system can include modules providing various functions or features. For example, the module may be a processing unit to process instructions and data, a storage unit that may include items such as nonvolatile memory or volatile memory, a communications unit that may connect the computing system to a network, or the module may provide a different function to the computing system. A processing unit for example may include a processor that needs to send data to another processing unit or to a storage unit. The connection between two modules may create a bottleneck where the inter-module data transfer rate exceeds the data processing or handling capabilities of the source module, destination module, or both the source and destination modules.

The connection between two modules may be limited by the frequency of the signal between the two modules and the propagation of the signal through an electrical conductor such as copper. An optical connection between the two modules may provide a higher transfer rate and more bandwidth compared to a similar connection through a copper conductor.

In some embodiments the copper conductor connecting two modules may be included in addition to an optical connector. Adding the optical connector to the back of a module can further reduce the airflow through the system and the reduced air flow may cause cooling problems for the system.

An optical connector may be placed on the top or the bottom of the module. An optical connector may have both a transmitter and a receiver. If a module is installed in a chassis the transmitter and receiver can be aligned so that the transmitter can transmit signals into optical communication path in the chassis and the receiver can receive signals from another optical communication path in the chassis. A first alignment device may be used for the transmitter and a second alignment device may be used for the receiver so that the transmitter and receiver in adjacent modules are properly aligned. The transmitter and receiver can be at different distances from the first side of the module and are located at a different position along the edge of the module. In one embodiment the positions of the transmitter and receiver may create a stair step pattern relative to the first side of the module.

Figure 1:
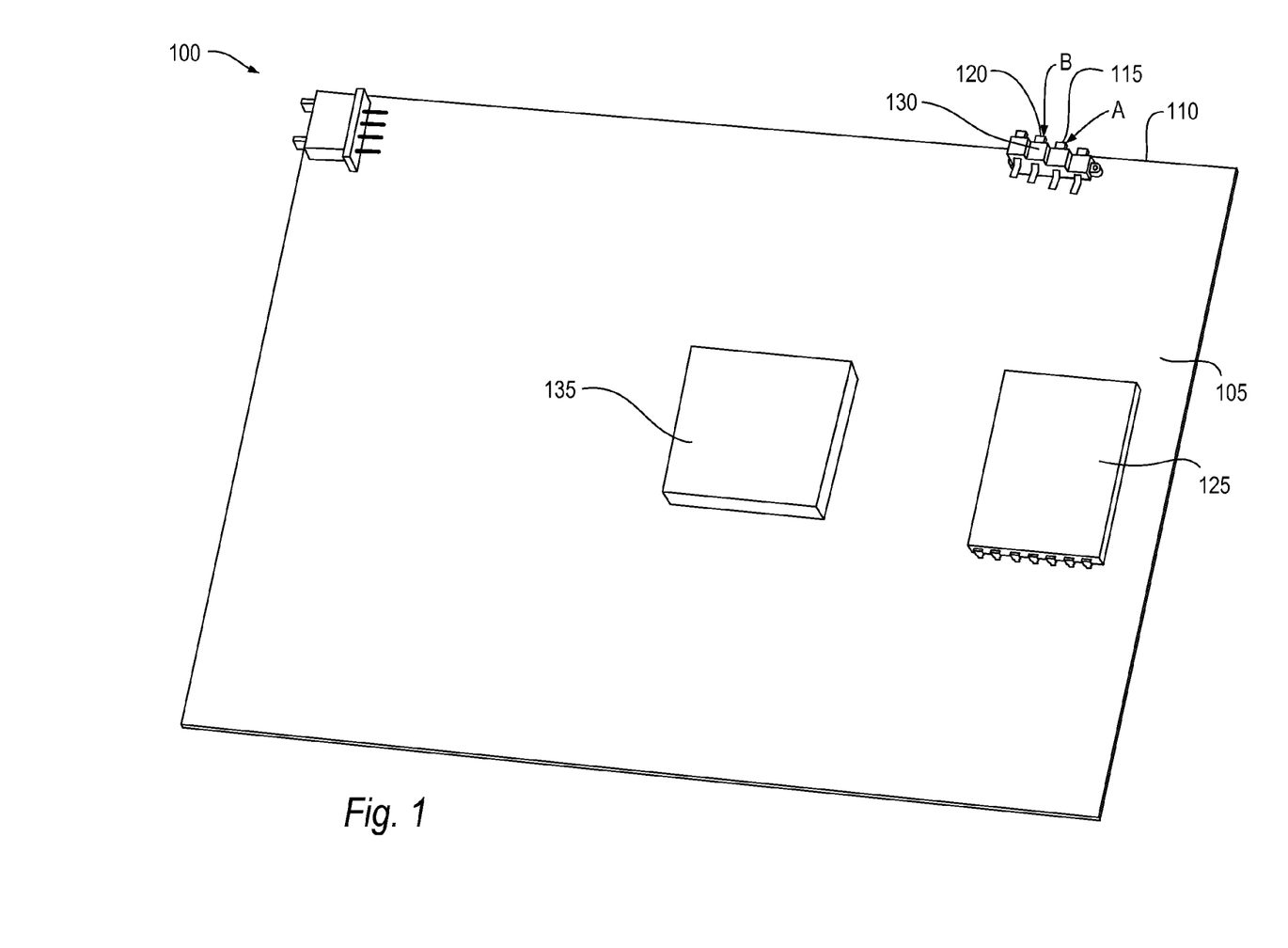
FIG. 1 is a module according to an example embodiment of the invention.

With reference to the figures, FIG. 1 is a module according to an example embodiment of the invention. The module 100 can communicate with another module of a computing system to add functionality to the computing system. For example the module may be a processor module to process data, instructions, or both, a storage module to store data, instructions or both, a communications module or another type of module. The module may be a printed circuit board with a component 135 or components attached to the printed circuit board. The printed circuit board may be within an enclosure forming all or a portion of the module.

The module 100 includes a first side 105. The module 100 includes a first edge 110. An optical transmitter connector 115 can be a first distance from the first side 105 at a first position A along the first edge 110. An optical receiver connector 120 can be a second distance from the first side where the first and the second distances are different. The optical receiver connector 120 can be at a second position B along the first edge 110.

The optical transmitter connector 115 and the optical receiver connector 120 can be connected to an optical chip 125. The optical chip 125 may create an optical signal that carries data received by the optical chip from for example another component. The optical chip 125 may receive optical signals carrying data and send that data to for example another component. The optical transmitter connector 115 and the optical receiver connector 120 may be optically connected to the optical chip 125. The optical chip 125 may transmit data from a processor, volatile storage such as random access memory, non-volatile storage such as a hard drive, a network connection or another data source. The optical chip 125 may receive data from another module.

The first position A along the first edge may be adjacent to the second position B. If the first position A and the second position B are adjacent then the optical transmitter connector 115 and the optical receiver connector 120 may be in a stair stepped pattern relative to the first side 105 and may be in a housing 130. The optical transmitter connector 115 may be in the same or different housing as the optical receiver connector 120.

A second module may have the optical transmitter connector 115 and the optical receiver connector 120 in the same or different positions as the first module. If the optical transmitter and receiver connectors are in the same position for each module then the position of a first and a second module would be interchangeable within a chassis. Where the optical transmitters and optical receivers are in different positions in the first and second modules, they can be configured by changing the connection between the optical chip 125, the optical transmitter connector 115, and the optical receiver connector 120. The position of the optical transmitter connector 115 and the optical receiver connector 120 can depend on the design of the first waveguide that connects the optical transmitter on the first module to the optical receiver on a second module and second waveguide that connects the optical receiver on the first module to the optical transmitter on the second module.

Figures 2, 4:
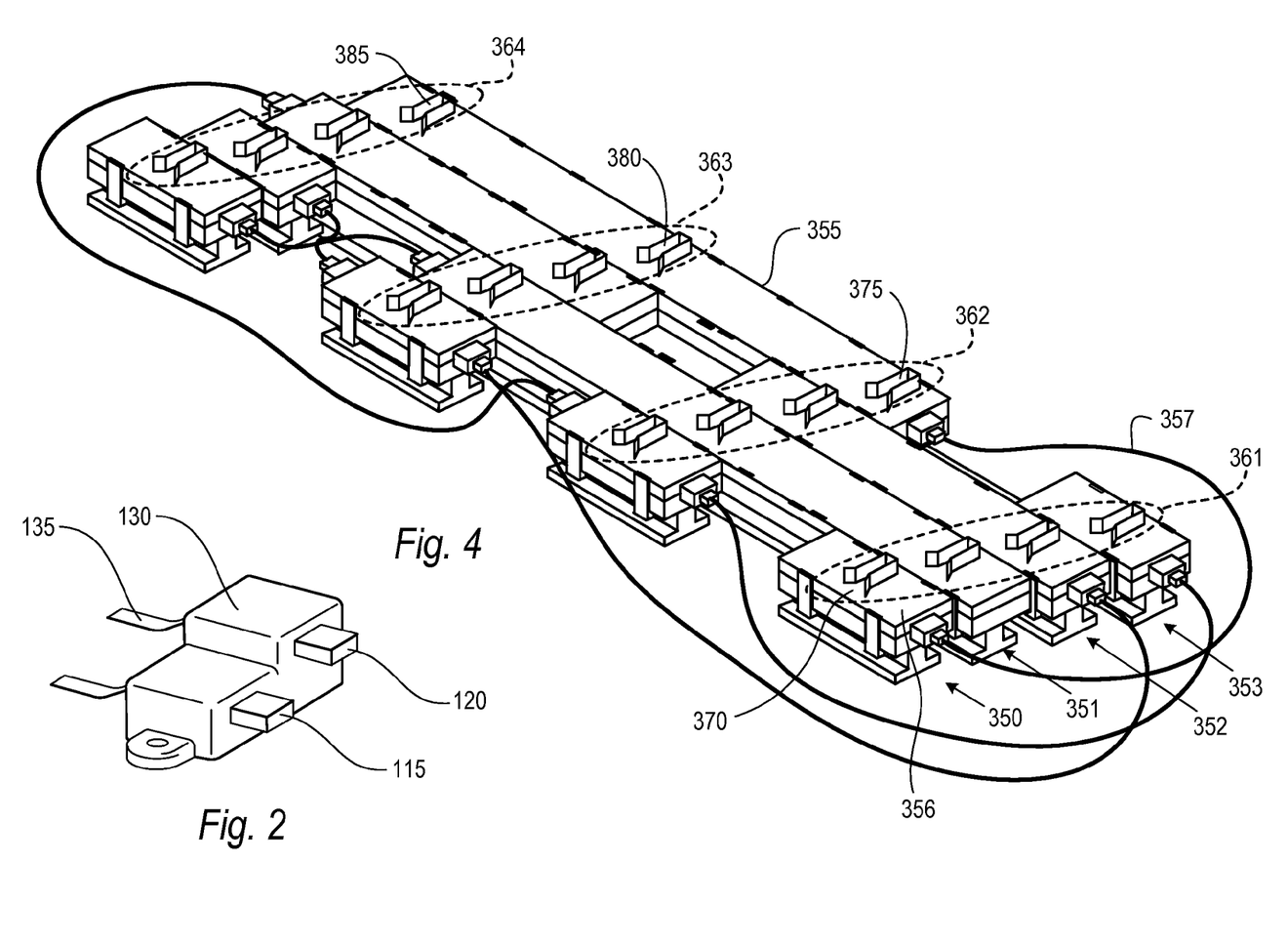
FIG. 2 is a connector according to an example embodiment of the invention.
FIG. 4 is a waveguide according to an example embodiment of the invention.

FIG. 2 is a connector according to an example embodiment of the invention. The connector may include a connector housing 130. The connector housing may include an optical transmitter connector 115, an optical receiver connector 120, or both. A resilient member can apply a force between the optical transmitter 115 or optical receiver 120 and a connector on a waveguide. For example the optical transmitter connector or optical receiver connector may be spring loaded to retract or apply force against a waveguide if a connection is made between the module and a waveguide. The optical transmitter or optical receiver connector may also be replaceable if the optical transmitter or optical receiver connector becomes damaged, worn out or is not compatible with the waveguide.

A connector may have multiple optical receiver connectors. For example a module may have one optical transmitter connector to transmit data to three other modules but have at least one receiver to receive data from the transmitters of each of the three other modules. The number of optical receivers a module includes can be the number of modules that the first module can connect to, for example if 4 modules communicated optically each module may have an optical transmitter and three optical receivers. A module may have more than one optical transmitters and more than one receiver per module it is communicating with to increase the bandwidth of the communication between the modules. An optical cable 135 can extend from the connector housing 130 to connect to an optical chip. There can be an optical cable for each of the connectors.

Figure 3:
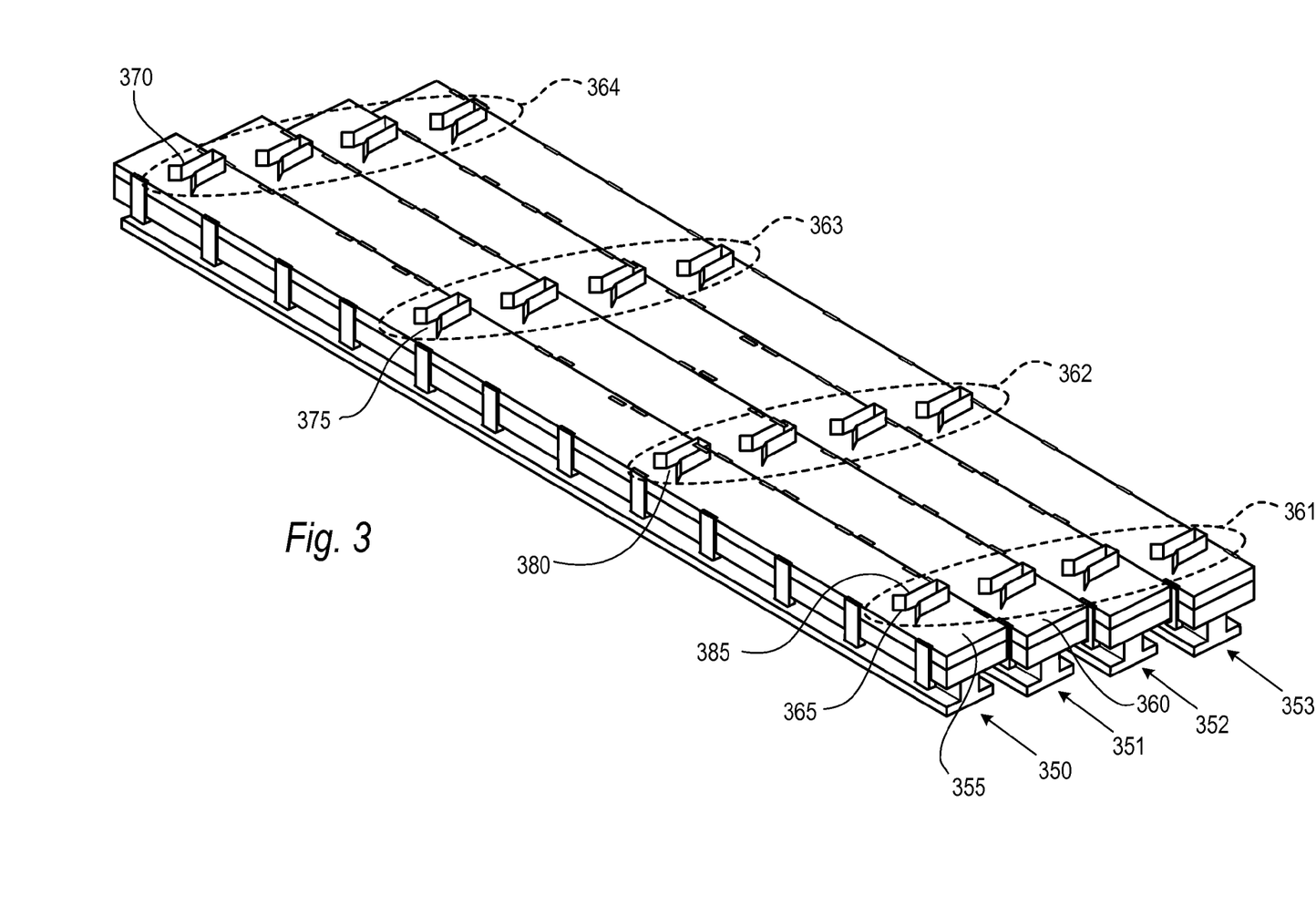
FIG. 3 is a waveguide according to an example embodiment of the invention.

FIG. 3 is a waveguide according to an example embodiment of the invention. The waveguide assembly may include a first waveguide 355, a second waveguide 360, or more waveguides depending on the communications bandwidth required between interconnected modules. FIG. 3 shows four waveguides in the assembly. The first waveguide 355 may include a first connector 370, a second connector 375, a third connector 380 and a fourth connector 385. The connectors 370, 375, 380 and 385 can allow the exit of an optical signal from the waveguide to a receiver or permit the entry of an optical signal from a transmitter to the waveguide. The waveguide may have the same number of connectors as the number of modules that are connected to the waveguide, for example if the waveguide is connected to the optical transmitter or optical receiver of two modules then the waveguide may have two connectors. The connectors 370, 375, 380 and 385 can have an alignment guide 365 to align an optical transmitter or optical receiver with an opening in the waveguide. The alignment guide may be, for example, three walls with two walls on opposing sides of the connector and the third wall at one end of the connector, the opposite end of the two walls includes an opening for the optical transmitter or optical receiver to enter the alignment guide. The waveguide 355, 360 may be, for example, a hollow metal waveguide, an optical fiber, or another light transmitting material.

If a waveguide of FIG. 3 was installed in a chassis each of the modules that connect to the waveguides would have to be reconfigured so that the optical transmitter of one module was connected through the waveguide to the optical receivers of another module. If the optical transmitter connector of the first module was in the same position along the first edge of the first module as the position of the optical transmitter connector of the second module then a first module would be connected to the connectors in column 361 and second module would be connected to the connectors in column 362, and a third module would be connected to connectors in column 363 and a fourth module connected to the connectors in column 364 with the optical transmitters connected to the connectors in row 350 and waveguide 355. Thus, the waveguide in row 350 would interconnect only optical transmitters and no receivers from the waveguides in row 351, 352 and 353 would be connected to these transmitters. If the waveguides in FIG. 3 were used in the chassis the optical transmitter in one of the modules would have to be moved to another position in the connector housing. For example, if there were only two modules then the optical transmitter connector 115 and the optical receiver connector 120 of FIG. 2 would have to be reversed. If the optical transmitter from the first module and optical receiver from the second module are connected by reversing the positions data can be transferred between the modules. If however, the optical transmitter of the first module and the optical transmitter of the second module were not reversed the first and the second modules could not communicate. The columns 361-364 and rows 350-353 of the wave may not be perpendicular to each other so that a connector from an optical transmitter or receiver does not have to pass over the connector in a different waveguide than the connector the connector was suppose to connect to.

FIG. 4 is a waveguide according to an example embodiment of the invention. The waveguide can include a first waveguide 355 connected to a second waveguide 356 through a flexible waveguide 357 such as a fiber optic cable. Portions of the waveguides 355 and 356 are in different rows 350 and 353. Having the waveguides partially in different rows may allow the modules to be designed with the optical transmitters and the optical receivers in the same position on different modules. For example the row 350 may be connectors for optical transmitters and rows 351, 352, and 353 can be connectors for optical receivers. The connector 370 in row 350 may be a connector for an optical transmitter and the connectors 375, 380 and 385 in row 353 may be connectors for optical receivers while connectors 370, 375, 380 and 385 are in different columns 361, 362, 363, and 364.

Figure 5:
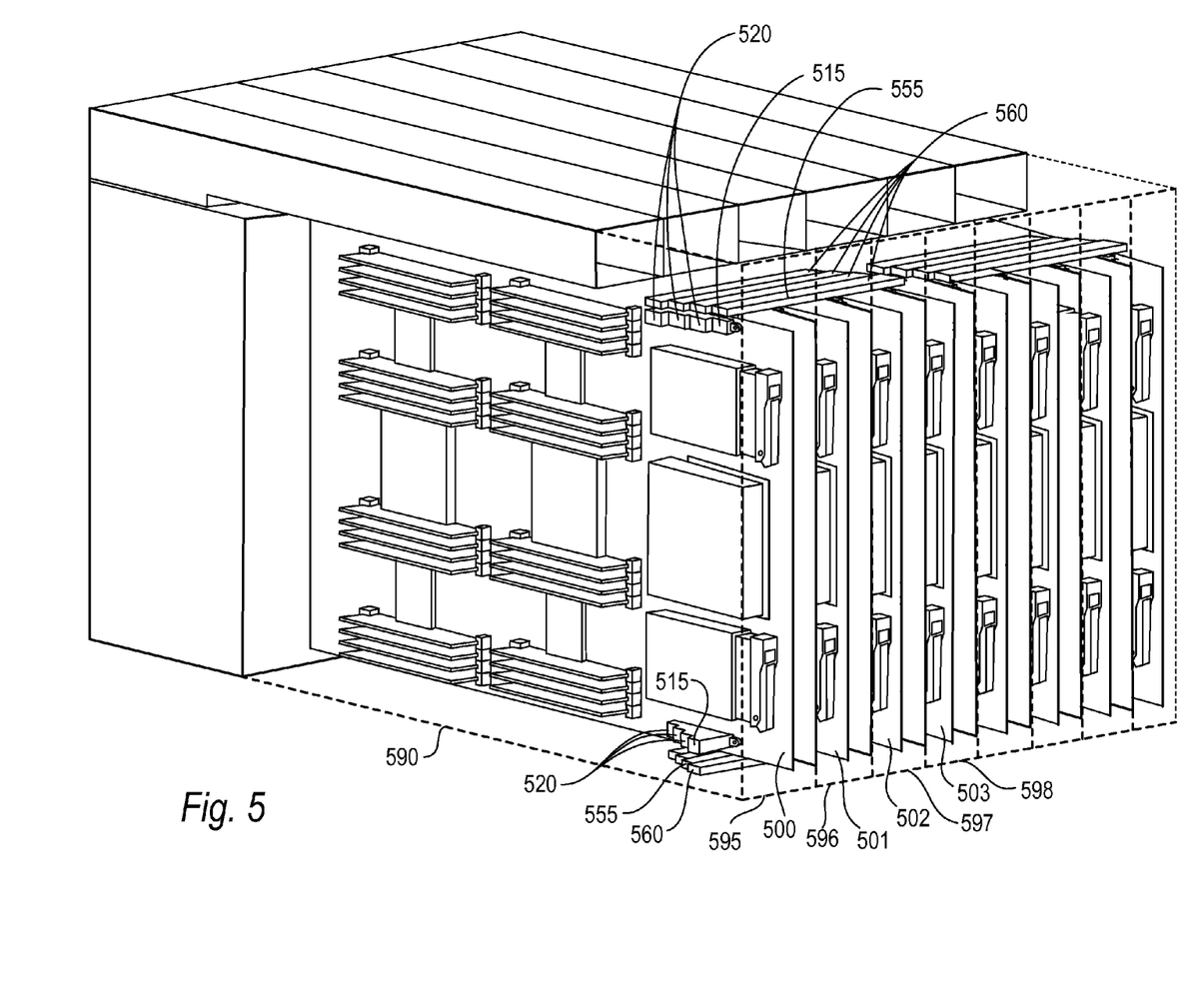
FIG. 5 is a chassis according to an example embodiment of the invention.

FIG. 5 is a chassis according to an example embodiment of the invention. The chassis 590 can include for example a first slot 595 in the chassis to receive a first module 500 and a second slot 596 in the chassis to receive a second module 501. A first waveguide 555 with a first connector located a first distance from a side of the first slot 595 and at a first position along the side of the first slot; and a second waveguide 560 with a second connector located a second distance from the side of the first slot at a second position along the side of the first slot. The first connector on the first waveguide may be aligned with the optical transmitter 315 and the second connector on the second waveguide may be aligned with the optical receiver 520 of the first module 595. There may be multiple optical transmitters 515 and receivers 520 connected to each of the other modules 501, 502 and 503 through the waveguides 555 and 560 between the slots 595, 596, 597 and 598 to increase the bandwidth of data transmission between the first module and the second module.

Figure 6:
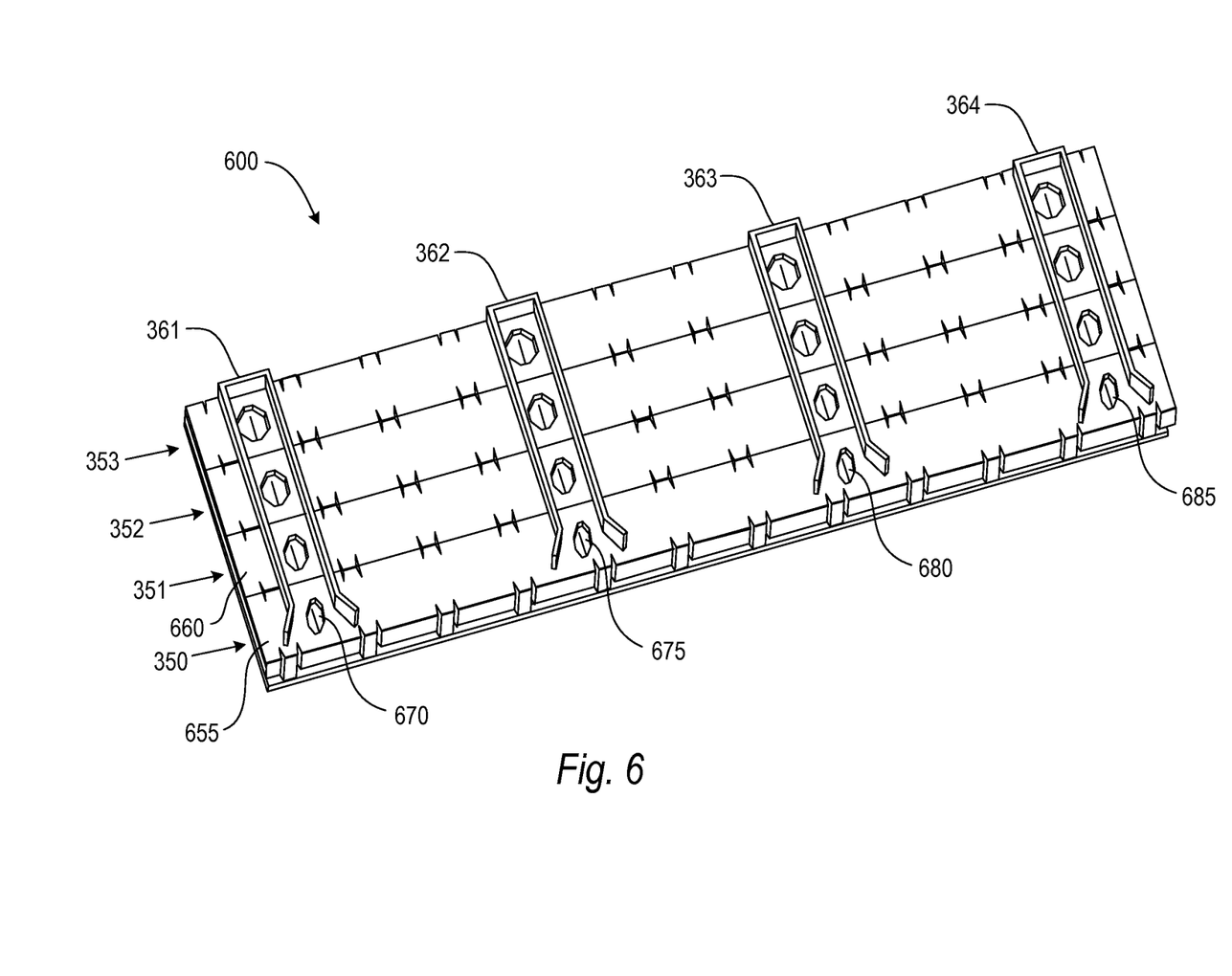
FIG. 6 is a waveguide according to an example embodiment of the invention.

FIG. 6 is a waveguide 600 according to an example embodiment of the invention. The waveguide can include connectors 670, 675, 680, and 685 in multiple columns 361, 362, 363, and 364. The connectors in each of the different rows 351, 352, 353 and 354 may have different shapes or sizes so that a connector for row 353 does not connect to the connector 670 in row 351 as the module is inserted in the chassis prior to being fully inserted in the chassis.

Figure 7:
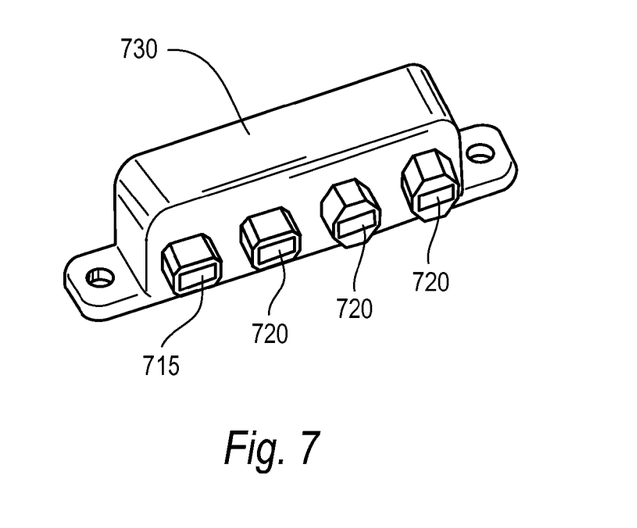
FIG. 7 is an optical connector according to an example embodiment of the invention.

FIG. 7 is an optical connector according to an example embodiment of the invention. The optical connector 730 includes optical transmitter connectors 715 and optical receiver connectors 720. The optical transmitter connector does not have to be the first connector in the connector and may be in any position on the optical connector 730. The connectors can be different sizes and different shapes to prevent the one of the connectors from connecting to one of the rows of the waveguide 600 before the connector is in the correct row to connect to the waveguide 600.

Figure 8:
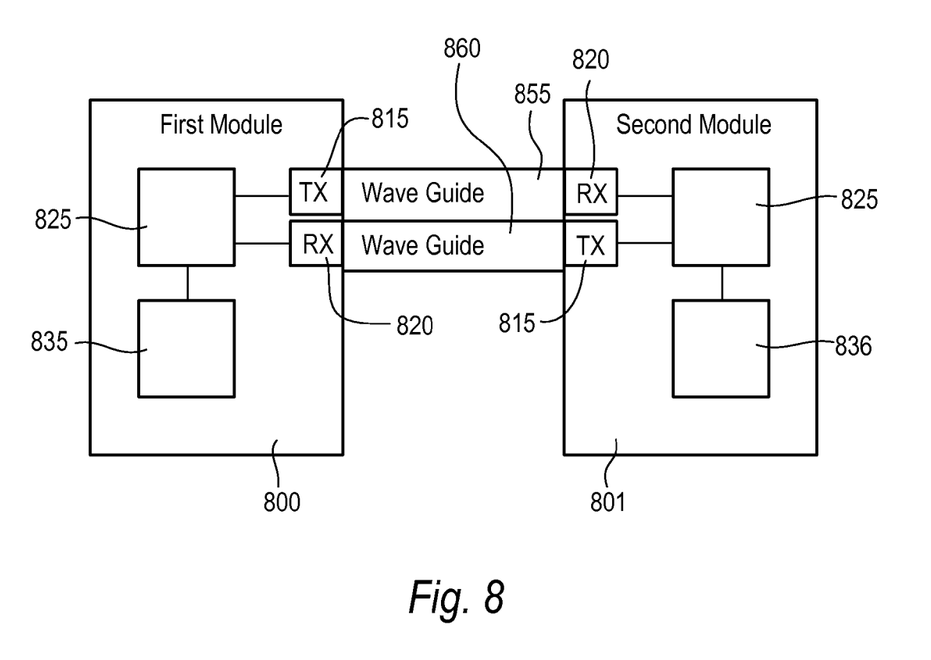
FIG. 8 is a block diagram according to an example embodiment of the invention.

FIG. 8 is a block diagram according to an example embodiment of the invention. The first module 800 can include a component 835 that is connected to an optical chip 825. The component 835 may be storage, a processor, an input output controller or another component. The optical chip 825 can be connected to the transmitter 815 and the receiver 820. The waveguide 855 can connect the optical transmitter 815 of the first component 800 to the optical receiver 820 of the second component 801. The waveguide 860 can connect the optical receiver 820 of the first module 800 to the optical transmitter 815 of the second module 801. The component 835 in the first module may be the same as component 836 in the second module or may be different components. For example if the first module 800 was a processor module the component 835 may be a processor and if the second module 801 was a storage module the component 836 may be a storage device such as a hard drive although the components 835 and 836 can be other components as well.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. An optical computing system comprising: a chassis; a slot in the chassis along which a removable module is moved to insert the module in the slot and remove the module from the slot; and a plurality of optical waveguides, each waveguide among the plurality of waveguides having U-shaped connectors and alignment guides arranged at different distances from a side of the slot to couple the waveguides to the module in response to the module being inserted into the slot, wherein the U-shaped connectors are arranged in a stair step pattern relative to a first side of the module.

2. The system of claim 1, wherein the plurality of waveguides are arranged in a plane.

3. The system of claim 1, wherein the U-shaped connectors couple the removable module to another removable module.

4. The system of claim 1, wherein the plurality of waveguides are arranged at different distances.

5. The system of claim 1, wherein the U-shaped connectors differ in shape and size from each other.

6. The system of claim 1, wherein the slot has a cross-section dimension orthogonal to the alignment guides, and the U-shaped connectors are arranged at different positions along the cross-sectional dimension.

7. An optical computing system comprising: a chassis; a plurality of slots along which a first set of removable circuit boards and a second set of removable circuit boards are inserted and removed; and a first set of optical waveguides, each waveguide among the first set of waveguides having a first plurality of U-shaped connectors and a first plurality of alignment guides arranged at different distances from the plurality of slots to optically couple the waveguides to the first set of removable circuit boards, wherein the U-shaped connectors are arranged in a stair step pattern relative to first sides of the first set of removable circuit boards.

8. The system of claim 7, further comprising: a second set of optical waveguides comprising a second plurality of alignment guides and a second plurality of U-shaped connectors to optically couple the waveguides of the second set of optical waveguides to the second set of removable circuit boards, wherein the second plurality of U-shaped connectors are arranged in a stair step pattern relative to first sides of the second set of removable circuit boards.

9. The system of claim 7, wherein the waveguides of the first set are arranged in a plane.

10. An optical computing system comprising: a chassis; a slot in the chassis along which a removable module is moved to insert the module in the slot and remove the module from the slot; and a plurality of optical waveguides, each optical waveguide among the plurality of optical waveguides having U-shaped connectors and alignment guides arranged at different distances from a side of the slot to couple the optical waveguides to the module in response to the module being inserted into the slot, wherein the U-shaped connectors and alignment guides are arranged in a stair step pattern relative to a first side of the module, and wherein the U-shaped connectors and alignment guides differ in shape and size from each other.

11. The system of claim 10, wherein each optical waveguide among the plurality of optical waveguides is arranged in a plane.

12. The system of claim 10, wherein the U-shaped connectors couple the removable module to another removable module.

13. The system of claim 10, wherein the slot has a cross-section dimension orthogonal to the alignment guides, and the U-shaped connectors are arranged at different positions along the cross-sectional dimension.

* * * * *